(12) United States Patent
Link et al.

(10) Patent No.: US 11,855,633 B2
(45) Date of Patent: Dec. 26, 2023

(54) PROGRAMMABLE LOGIC ARRAY WITH RELIABLE TIMING

(71) Applicant: STMICROELECTRONICS (ROUSSET) SAS, Rousset (FR)

(72) Inventors: Jean-Francois Link, Trets (FR); Mark Wallis, Mouans Sartoux (FR); Joran Pantel, Marseilles (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 34 days.

(21) Appl. No.: 17/827,515

(22) Filed: May 27, 2022

(65) Prior Publication Data

US 2023/0387917 A1  Nov. 30, 2023

(51) Int. Cl.
| | |
|---|---|
| *H03K 19/17724* | (2020.01) |
| *H03K 19/173* | (2006.01) |
| *H03K 19/17704* | (2020.01) |
| *H03K 3/0233* | (2006.01) |
| *H03K 19/096* | (2006.01) |

(52) U.S. Cl.
CPC ..... *H03K 19/17724* (2013.01); *H03K 3/0233* (2013.01); *H03K 19/096* (2013.01); *H03K 19/1737* (2013.01); *H03K 19/17708* (2013.01)

(58) Field of Classification Search
CPC ............ H03K 19/1737; H03K 19/177; H03K 19/17704; H03K 19/17724; H03K 19/17736; H03K 19/1774
See application file for complete search history.

(56) References Cited

U.S. PATENT DOCUMENTS

| | | | |
|---|---|---|---|
| 5,046,035 A | 9/1991 | Jigour et al. | |
| 5,144,166 A * | 9/1992 | Camarota | H03K 19/17728 327/197 |
| 5,614,844 A | 3/1997 | Sasaki et al. | |
| 5,835,998 A | 11/1998 | Pedersen | |
| 6,011,407 A | 1/2000 | New | |
| 6,057,708 A | 5/2000 | New | |
| 6,084,447 A | 7/2000 | Graf, III | |
| 6,184,707 B1 | 2/2001 | Norman et al. | |
| 6,329,839 B1 | 12/2001 | Pani et al. | |
| 6,614,314 B2 | 9/2003 | d'Haene et al. | |
| 6,651,231 B2 | 11/2003 | Morikawa | |
| 6,686,769 B1 | 2/2004 | Nguyen et al. | |
| 6,748,577 B2 | 6/2004 | Bal | |
| 7,003,423 B1 | 2/2006 | Kabani et al. | |
| 7,218,133 B2 | 5/2007 | Lewis et al. | |
| 8,334,712 B2 | 12/2012 | Klein et al. | |
| 8,664,975 B1 | 3/2014 | Gao et al. | |
| 8,675,681 B2 | 3/2014 | Hill et al. | |
| 8,838,852 B1 | 9/2014 | Sullam et al. | |

(Continued)

OTHER PUBLICATIONS

U.S. Appl. No. 17/733,934, filed Apr. 29, 2022.

*Primary Examiner* — Jason Crawford
(74) *Attorney, Agent, or Firm* — Seed IP Law Group LLP (57) ABSTRACT

An integrated circuit includes a programmable logic array. The programmable logic array incudes a plurality of logic elements arranged in rows and columns. Each logic element includes a direct output and a synchronized output. The direct output of each logic element is coupled to all other logic elements of higher rank, but is not coupled to logic elements of lower rank.

20 Claims, 7 Drawing Sheets

(56) References Cited

U.S. PATENT DOCUMENTS

| | | | |
|---|---|---|---|
| 8,913,601 B1* | 12/2014 | Kaviani | H03K 19/17736 |
| | | | 370/386 |
| 8,977,882 B2 | 3/2015 | Garg et al. | |
| 9,106,235 B2 | 8/2015 | Dally | |
| 9,577,648 B2 | 2/2017 | Shivaram et al. | |
| 9,690,278 B1* | 6/2017 | Chen | H04L 45/586 |
| 9,787,311 B1* | 10/2017 | Ooi | H03K 19/17728 |
| 10,587,271 B2 | 3/2020 | Wang et al. | |
| 2013/0093461 A1* | 4/2013 | Voogel | H03K 19/1776 |
| | | | 326/38 |
| 2016/0182054 A1 | 6/2016 | Westwick et al. | |
| 2016/0261272 A1* | 9/2016 | Ikeda | H03K 19/17758 |
| 2017/0215745 A1 | 8/2017 | Felix et al. | |
| 2017/0262567 A1* | 9/2017 | Vassiliev | H03K 19/17736 |
| 2019/0379380 A1* | 12/2019 | Atsatt | H01L 25/18 |
| 2020/0344180 A1* | 10/2020 | Pope | G06F 9/28 |

* cited by examiner

PROGRAMMABLE LOGIC ARRAY WITH RELIABLE TIMING

BACKGROUND

Technical Field

The present disclosure is related to integrated circuits, and more particularly, to integrated circuits including a programmable logic array (PLA).

Description of the Related Art

Many integrated circuits include a programmable logic array (PLA). A PLA may include programmable logic elements connected to each other and to the PLA input/output signals by a programmable interconnect. The interconnect may include multiplexers which are controlled by configuration registers. A logic element can be programmed to combine one or more of its inputs to generate a single output, whose state is a Boolean function of the input states. The output state may or may not be captured by a flip-flop or latch.

In a synchronous system, i.e., a system including combinational logic paths connecting the output of one flip-flop to the input of another, where both flip-flops are clocked by the same clock signal, it is desirable for the propagation delay of the logic path to be smaller than a period of the clock signal. This allows for proper set-up times at the input of the destination flip-flop. If this constraint is not respected, the output state of the destination flip-flop can be unpredictable.

It can be very difficult for a programmer of a PLA to ensure safe timing relationships between flip-flops. This is a result of the unpredictable combinational path delays inherent in the programmable logic and interconnects. In many cases, programmers of the PLA can become frustrated if the PLA does not perform the programmed function due to timing delays.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

Embodiments of the present disclosure provide a PLA that reduces timing errors by introducing, at the hardware level of the PLA, constraints that ensure that any allowed configuration of the PLA will result in proper timing. Rather than enabling a programmer to connect the logic elements of the PLA in any conceivable way, the PLA in accordance with principles of the present disclosure includes only connection paths that results in proper timing. Connection paths that could result in timing errors are not available at the hardware level.

In one embodiment, each logic element includes a direct output and a synchronized output. The synchronized output is synchronized with a PLA clock signal. The direct output is not synchronized with the PLA clock signal. Because the synchronized output is synchronized with the PLA clock signal, timing or setup and hold errors generally do not occur when passing the synchronized output to the input of another logic element. However, because the direct output is not synchronized with the PLA clock signal, it is possible that there may be timing errors in certain situations. Accordingly, the PLA implements constraints that ensure that the direct output of a logic element cannot be passed to the input of certain of the logic elements that will be more likely to result in timing errors.

In one embodiment, the PLA includes logic elements arranged in rows and columns. Each row extends between an input end and an output end of the PLA. The rank of a column corresponds to its proximity to the input end, with a lower rank being closer to the input end. The PLA does not include signal paths connecting the direct output of a logic element in one column to the input of a logic element in a column of lower rank. This ensures that set up times between logic elements will be satisfied.

The constraints of the direct outputs are implemented at the hardware level. In particular, signal paths are not available to directly connect the direct output of a logic element to an input of a logic element of a lower rank. When a user of the PLA programs the PLA, direct output connections to logic elements of a lower rank are simply not available. The remaining possible programming schemes of the PLA will result in no timing errors. Accordingly, embodiments of the present disclosure result in a PLA that greatly reduces the possibility of poorly functioning or nonfunctioning arrangements.

BRIEF DESCRIPTION OF THE SEVERAL VIEWS OF THE DRAWINGS

Reference will now be made by way of example only to the accompanying drawings. In the drawings, identical reference numbers identify similar elements or acts. In some drawings, however, different reference numbers may be used to indicate the same or similar elements. The sizes and relative positions of elements in the drawings are not necessarily drawn to scale. For example, the shapes of various elements and angles are not necessarily drawn to scale, and some of these elements may be enlarged and positioned to improve drawing legibility.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known systems, components, and circuitry associated with integrated circuits have not been shown or described in detail, to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to." Further, the terms "first," "second," and similar indicators of sequence are to be construed as interchangeable unless the context clearly dictates otherwise.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its broadest sense, that is as meaning "and/or" unless the content clearly dictates otherwise.

Figure 1:
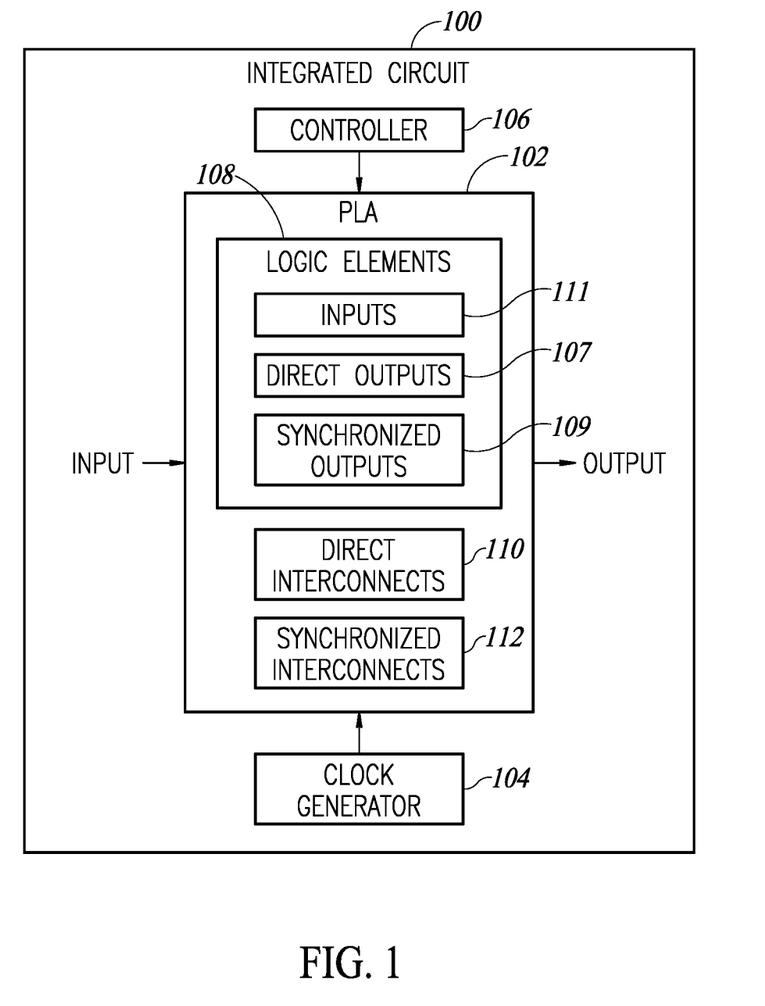
FIG. 1 is a block diagram of an integrated circuit including a PLA, according to one embodiment.

FIG. 1 is a block diagram of an integrated circuit 100, according to one embodiment. The integrated circuit 100 includes a PLA 102, a clock generator 104, and a controller 106. The PLA 102 includes a plurality of logic elements 108, a plurality of direct interconnects 110, and a plurality of synchronized interconnects 112. As will be set forth in more detail below, the components of the PLA 102 cooperate to ensure that timing errors do not occur after programming the PLA 102.

The PLA 102 includes an input side and an output side. The input side may receive one or more input signals from sources external to the PLA 102. The output side may provide one or more signals after processing the input signals in accordance with the programmed logic of the PLA 102. As used herein, "input side" and "output side" correspond to logical sides of the PLA 102 and are not necessarily physical locations. The input side may refer to the set of input signals of the PLA 102 and the output side may refer to the set of output signals of the PLA 102. The actual signals may be located anywhere on the PLA physical implementation Each logic element 108 includes a plurality of inputs 111, a plurality of direct outputs 107, and a plurality of synchronized outputs 109. The logic elements 108 may be arranged in rows and columns. The arrangement of logic elements 108 may refer to the conceptual or logical arrangement, not physical arrangement, as integrated circuit physical layouts may be highly complex and the physical locations or physical proximity of two circuit elements may not fully align with their positions in a circuit diagram as the metal interconnections that connect two circuit elements may undergo complex routing. Each row of logic elements 108 may be called a block. Each column of logic elements 108 includes a rank. The rank corresponds to the proximity of the logic element to an input side of the PLA 102. As utilized herein, the lower the rank of a column, the closer that column is to the input side of the PLA 102. However, other ranking schemes can be utilized without departing from the scope of the present disclosure.

As used herein, "proximity", "distance" and "closeness" of a logic element to the input side may correspond to proximity in terms of logic flow or circuit flow rather than absolute physical proximity. As set forth above, this is due to the fact that physical integrated circuit layouts may be highly complex and metal interconnection layouts (including metal lines and conductive vias) may be such that two circuit elements that are nearby in terms of logic flow or circuit flow may be relatively distant in terms of physical location. Likewise, two circuit elements that are physically close to each other may be relatively distant in terms of logic flow or circuit flow. As used herein, "upstream" or "downstream" relationships refer relationships in terms logic flow or circuit flow.

Each logic element 108 includes a plurality of inputs 111. Each input may receive one or more input signals from the input of the PLA 102, the direct output signals from the direct outputs 107 of the logic elements 108 of the PLA 102, and the synchronized output signals from the synchronized outputs 109 of the logic elements 108 of the PLA 102.

The synchronized interconnects 112 are signal lines that electrically connect the synchronized outputs 109 of the logic elements 108 to the inputs 111 of the logic elements 108. In one embodiment, the synchronized interconnects 112 may enable connecting the synchronized output of a logic element to an input 111 of any of the logic elements 108, including logic elements of lower rank. The synchronized interconnects 112 may include conductive vias, metal lines, and other metal interconnects formed in various layers of the integrated circuit 100. In some cases, the synchronized interconnects 112 may include one or more switches that can selectively connect and disconnect synchronized interconnects 112.

The direct interconnects 110 are signal lines that electrically connect the direct outputs 107 of the logic elements 108 to the inputs 111 of the logic elements 108. In one embodiment, the direct interconnects 110 are constrained in a way that the synchronized interconnects 112 are not constrained. Whereas the synchronized interconnects 112 may enable connecting the synchronized output of the logic elements 108 to an input of any other logic element in the PLA 102, or in a designated block or section of the PLA 102, the direct interconnects 110 do not allow connection of the direct outputs 107 to the inputs 111 of some of the logic elements 108.

In one embodiment, the direct interconnects 110 do not enable the direct output 107 of a logic element 108 to be connected to an input 111 of a logic element 108 of a lower rank. This can be accomplished by physically forming the direct interconnects 110 so that there are not direct interconnects 110 physically available to connect the direct outputs 107 of a logic element 108 to an input 111 of a logic element 108 of a lower rank.

The constraints on the direct interconnects 110 help ensure that there are no timing errors when processing signals within the PLA 102. The result is that programmers of the PLA can be sure that any allowed programming configuration of the PLA 102 will be free of timing errors. This can be highly beneficial because the PLA 102 will function properly after programming.

The clock generator 104 generates the clock signal CLK for the PLA 102. The clock signal CLK can be passed to the logic elements 108. The synchronized outputs 109 can be synchronized with the clock signal CLK provided by the clock generator 104. While the clock generator 104 is shown as being external to the PLA 102, in some cases the clock generator 104 may be part of the PLA 102.

The controller 106 can be utilized to program the PLA 102. The controller 106 can receive programming inputs for configuring the logic elements 108 of the PLA 102. The controller 106 can enable a programmer of the PLA 102 to specifically program each logic element 108 in a desired manner. Programming of the PLA 102 can include writing specific data values to memories of the logic elements 108. The values in the memory 108 determines, in part, the output that will be provided by the logic elements 108 is based on the inputs 111 of the logic elements 108. Programming of the PLA 102 can also include determining which inputs 111 will be utilized to generate outputs. The formation of the direct interconnects 110 as described previously ensures that the direct outputs 107 of a logic element will not be utilized as an input 111 of a logic element 108 of lower rank.

The controller 106 can provide an interface by which users can program the PLA 102. In some cases, users can program the PLA 102 via an interface provided by another circuit or system that is electrically connected to the integrated circuit 100. The external circuit or system can enable a user to program the PLA 102 within the constraints implemented by the controller 106. The controller 106 programs each logic element 108 in accordance with the program and commands received via the interface and in accordance with the constraints implemented by the direct interconnects 110.

Figure 2:
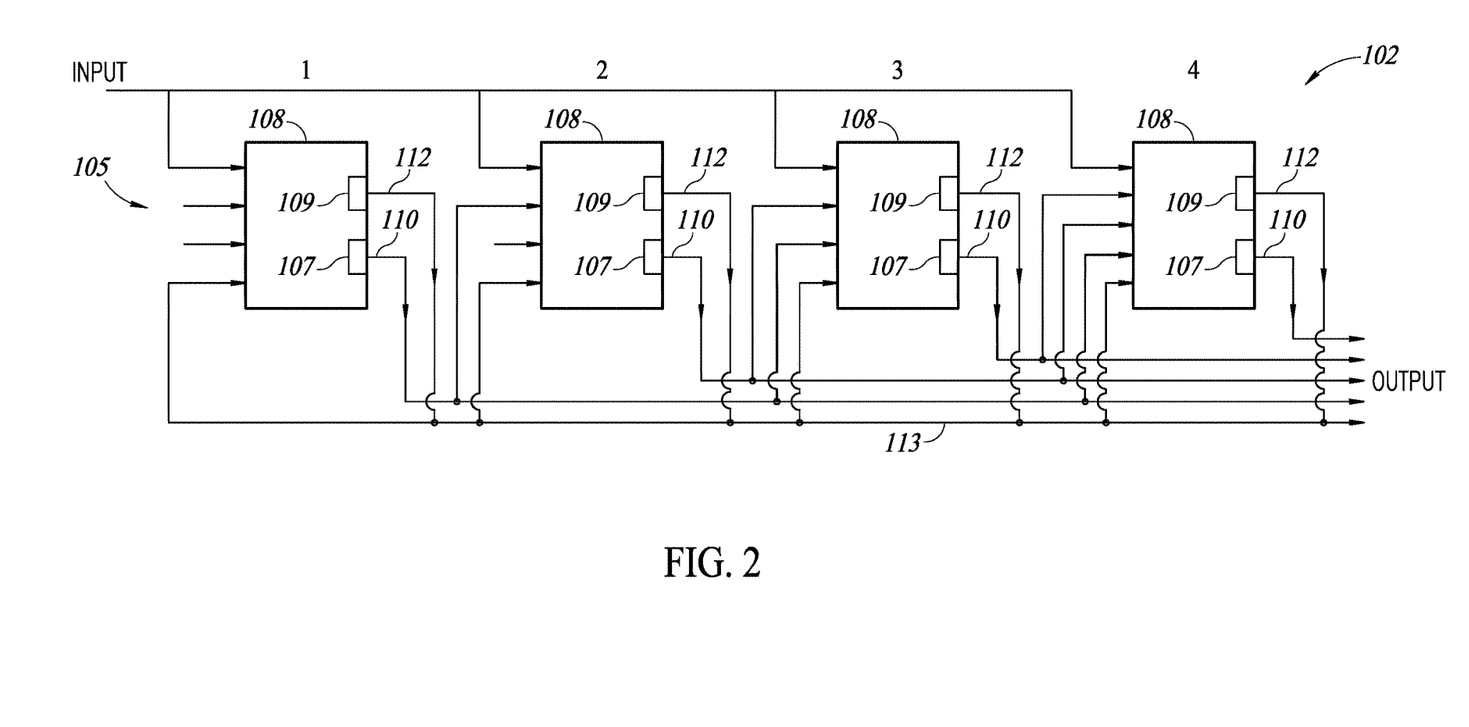
FIG. 2 is a schematic diagram of a block of a PLA, according to one embodiment.

FIG. 2 is a block diagram of a portion of a PLA 102, according to one embodiment. More particularly, FIG. 2 is a block diagram of a block 105 of the PLA 102. The block 105 corresponds to a row of logic elements 108 of the PLA 102. In practice, the PLA 102 may include multiple parallel blocks 105. In this way, the PLA 102 may be arranged in rows and columns of logic elements 108. For simplicity in illustrating some principles of the present disclosure, only a single block 105 is shown in FIG. 2.

The block 102 includes an input side and an output side. The input side receives inputs from sources external to the PLA 102. FIG. 2 illustrates a single input signal at the input side. However, in practice, there may be several input signals or bit values received at the input side of the PLA 105. The output side outputs a plurality of data signals from the PLA 102. The data values provided at the output side are based on the data values received at the input side and on the programming of each logic element 108 of the PLA 102.

Each logic element 108 of the block 105 has a rank between 1 and 4. The closest logic element 108 to the input side has a rank of 1. The next closest logic element 108 to the input side has a rank of 2. The next closest logic element 108 to the input side has a rate of 3. The farthest logic element 108 from the input side has a rank of 4. Accordingly, and in the scheme shown herein, a lower rank corresponds to closer proximity to the input side. In examples in which there are multiple parallel blocks 105, each rank will correspond to a column of logic elements 108.

Each logic element 108 includes a plurality of inputs 111, a direct output 107, and a synchronized output 109. Internal circuitry within the logic element 108 may determine which of the input signals will be utilized in generating the output. Typically, the direct outputs 107 and the synchronized output 109 have a same value, except that the synchronized output 109 is synchronized with the clock signal CLK.

The synchronized output 109 of each logic element 108 is coupled to a synchronized interconnect 112. As used herein, "synchronized interconnect" corresponds to a conductive interconnect that is connected to the synchronized output 109 of the logic elements 108. The synchronized interconnects 112 of each logic element 108 are provided to an input of each of the logic elements 108. FIG. 2 illustrates all of the synchronized interconnects 112 join into a single bus 113, for simplicity of illustration. Accordingly, the line 113 corresponds to a plurality of separate synchronized interconnects 112 each connecting individually to an input of each of the logic elements 108, including the same logic element from which the synchronized interconnect 112 receive the direct output.

The direct output 107 of the logic element 108 of rank 1 is connected to an input of each of the logic elements 108 of ranks 2, 3, and 4. The direct output 107 of the logic element 108 of rank 2 is connected to an input of each of the logic elements of ranks 3 and 4. The direct output 107 of the logic elements 108 of rank 3 is connected to an input of the logic elements 108 of rank 4. The direct output 107 of the logic elements 108 of rank three is not connected to an input of the logic elements of ranks 1, 2, and 3. The direct output 107 of the logic element 108 of rank 4 is not connected to the input of any of the logic elements 108 of the block 105.

The direct interconnects 110 provide the connections to the direct outputs 107 described above. In contrast to the synchronized interconnects 112, each direct interconnect 110 is drawn individually to illustrate the principle that the direct output of a logic element 108 is only connected to inputs of logic elements 108 of higher rank.

Figure 3:
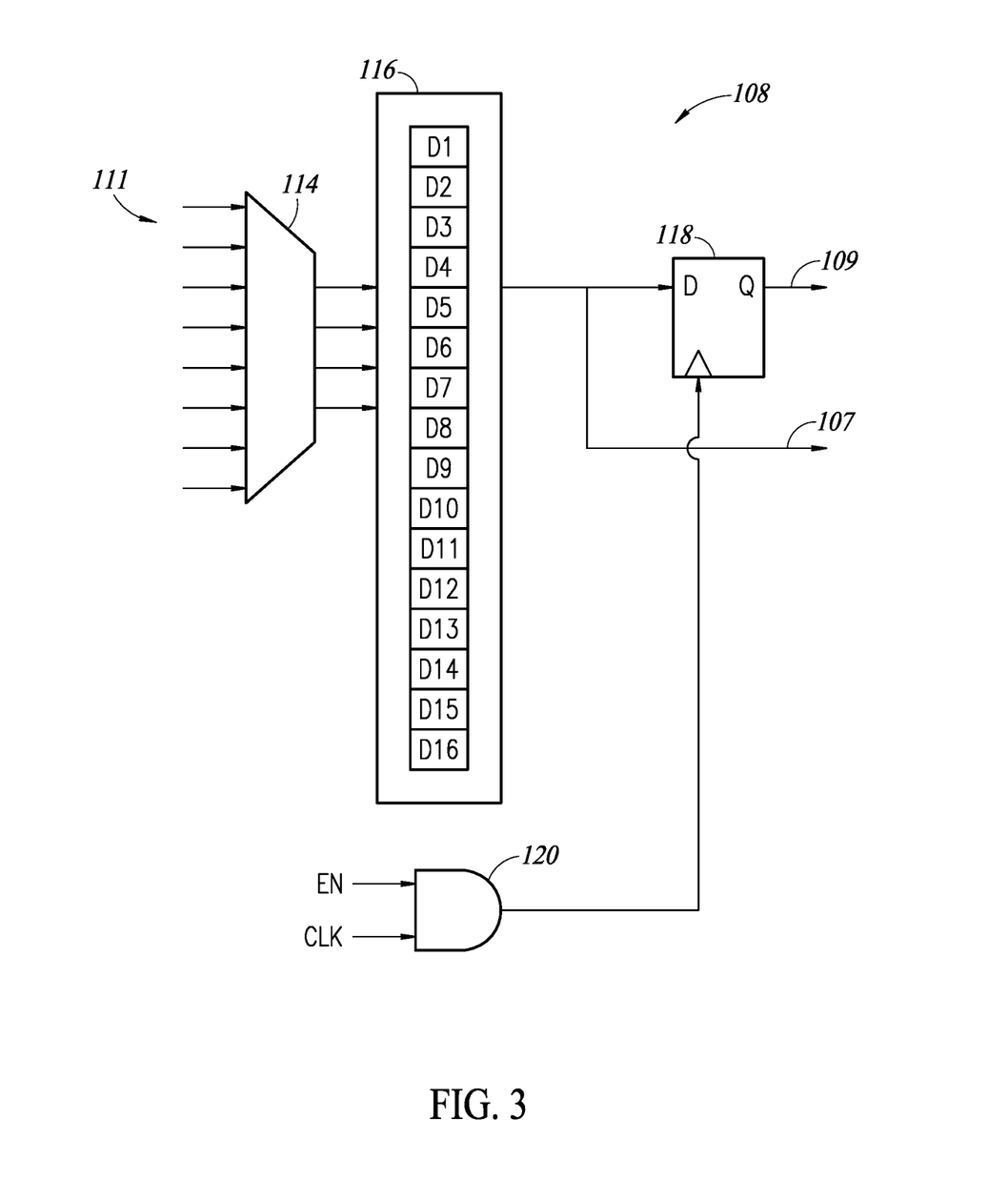
FIG. 3 is a schematic diagram of a logic element of a PLA, according to one embodiment.

FIG. 3 is a schematic diagram of a logic element 108 of a PLA 102, according to one embodiment. The logic element 108 of FIG. 3 is one embodiment of a logic element 108 that can be utilized for the logic elements 108 of FIGS. 1-2, and for subsequent figures. While FIG. 3 illustrates a specific embodiment of a logic element 108, other configurations of logic elements 108 can be utilized without departing from the scope of the present disclosure.

The logic element 108 includes a multiplexer 114, a memory 116, and a flip-flop 118. The multiplexer 114 corresponds to the input side of a logic element 108. In particular, the multiplexer 114 may have a plurality of inputs 111. The inputs 111 can include synchronous outputs of all of the logic elements 108 of a block. The inputs 111 can include the direct outputs of all of the logic elements of lower rank. The inputs 111 can include one or more inputs of the PLA 102. In practice there may be a large number of inputs.

The multiplexer 114 provides a plurality of outputs. In the example of FIG. 3, the multiplexer 114 has four outputs. In this case, a control signal (not illustrated) is provided to the multiplexer 114 to determine which of the inputs 111 will be provided at the outputs of the multiplexer 114. Because the multiplexer 114 does not receive the direct output of logic elements 108 of higher or equal rank, setup and hold errors or timing errors can be avoided in the PLA 102. The multiplexer 114 can receive other numbers of inputs and can provide other numbers of outputs that are shown in FIG. 3 without departing from the scope of the present disclosure.

In one embodiment, the memory 116 is a register with 16 data values d1-d16. Each data value may be a binary value of 0 or 1. The register outputs one of the data values d1-d16 depending on the combination of data values received from the multiplexer 114. In this case, the outputs of the multiplexer 114 effectively correspond to an address for the register 116. If the multiplexer provides, on the four outputs, a value of 0000, then the register 116 will output the value stored in d1. If the multiplexer provides, on the four outputs a value of 1111, then the register 116 will output the value stored in d16. Accordingly, each four bit value received from the multiplexer 114 corresponds to one of the 16 data storage locations of the register 116. While FIG. 3 illustrates that the memory 116 is a register, other types of memories can be utilized for logic element 108 without departing from the scope of the present disclosure.

Programming the logic elements 108 includes selecting a value for each of the data values d1-d16 and writing the selected data values to the memory 116. Programming of the logic elements 108 can also include selecting a value for the control signal provided to the multiplexer 114. The value of the control signal determines which of the inputs 111 will be provided at the outputs of the multiplexer 114.

The logic elements 108 includes a flip-flop 118. The flip-flop 118 receives, on a data input terminal, the output of the memory 116. The data output terminal of the flip-flop 118 corresponds to the synchronized output 109 of the logic element 108.

Logic element 108 also includes an AND gate 120. The AND gate 120 includes a first input that receives and enable signal En and a second input that receives the clock signal CLK of the PLA 102. If the enable signal is high, then the clock signal CLK is passed to the clock input terminal of the flip-flop 118. Accordingly, at the rising edge of the clock signal of the clock input terminal 118, the value data present at the data input terminal is passed to the data output terminal of the flip-flop 118. Accordingly, the output of the flip-flop 118 is synchronized with the clock signal CLK of the PLA 102.

The logic element 108 also provides a direct output 107. The direct output 107 corresponds to the output of the memory 116, without being passed through the flip-flop 118 accordingly, the direct output 107 of the logic elements 108 is not synchronized with the clock signal CLK.

Figure 4:
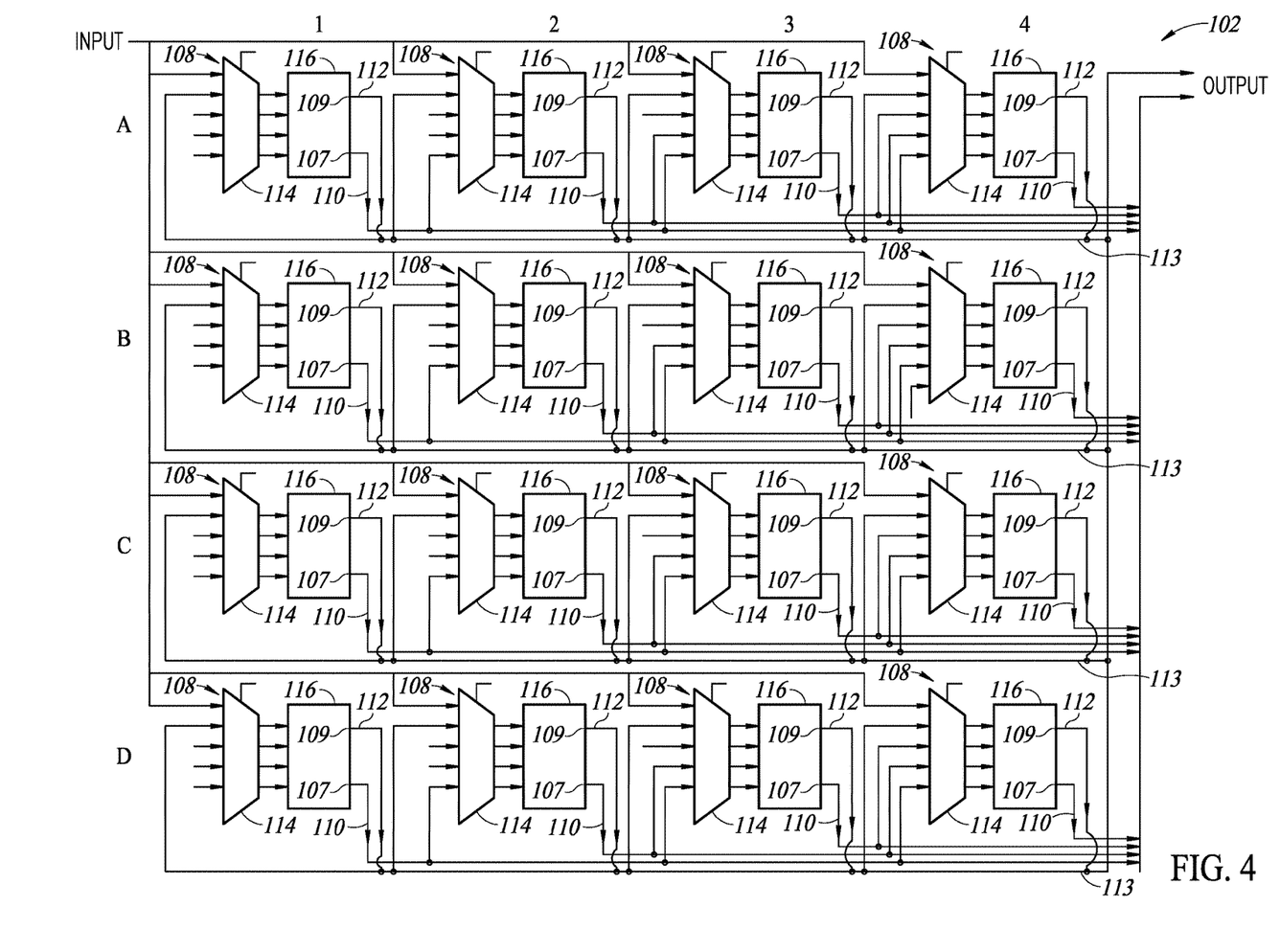
FIG. 4 is a schematic diagram of a PLA, according to one embodiment.

FIG. 4 is a schematic diagram of a PLA 102, in accordance with some embodiments. The PLA 102 of FIG. 4 includes four blocks 105, A-D. Each block corresponds to a row of logic elements 108. In the example of FIG. 4, each block includes four logic elements 108. However, in practice, each block can have fewer or more logic elements 108 than are shown in FIG. 4.

The PLA 102 of FIG. 4 includes four columns 1-4 of logic elements 108. The number assigned to each column in FIG. 4 corresponds to the rank in that column. Accordingly, the logic elements 108 of column 1 have rank 1. The logic elements 108 of column 2 have rank 2. The logic elements 108 of column 3 have rank 3. The logic elements 108 of column 4 have rank 4.

Each logic element 108 may be substantially identical to the logic elements 108 shown in FIG. 3. In particular, each logic element one may have a multiplexer 114, a memory 116, and the flip-flop 118. FIG. 4 does not illustrate the flip-flop 118 that provides the synchronized output. However, in practice, the flip-flop 118 is present in each of the logic elements 108 of FIG. 4, as shown in FIG. 3. Alternatively, a different sort of synchronizer may be present in the logic elements 108 to provide the synchronized output 109.

Each block of logic elements 108 is arranged as shown in FIG. 2. In particular, the direct output of each logic element 108 of a block is coupled to an input of each logic element 108 a higher rank. The direct outputs 107 of each logic element is not provided to the logic elements of equal or lower rank. The direct interconnects 110 couple the direct outputs 109 to the inputs of the various logic elements 108.

The synchronized output 109 of each logic element 108 of a block are provided to an input of each of the logic elements of the block, regardless of rank. FIG. 4 illustrates, for each block, a bus 113 that corresponds to each of the individual synchronized interconnects 112 of the block. Accordingly, each of the synchronized interconnects 112 are provided individually to an input of each of the logic elements 108 of a block.

The output of the PLA 102 includes the direct output of each logic element 108 of the blocks A-D. Accordingly, the PLA 102 outputs 16 direct outputs. The output of the PLA 102 includes the synchronized output 109 of each logic element 108 of the blocks A-D. Accordingly, the PLA 102 outputs 16 synchronized outputs. The input of the PLA is provided to the inputs of each of the logic elements 108 of each of the blocks A-D.

Figure 5:
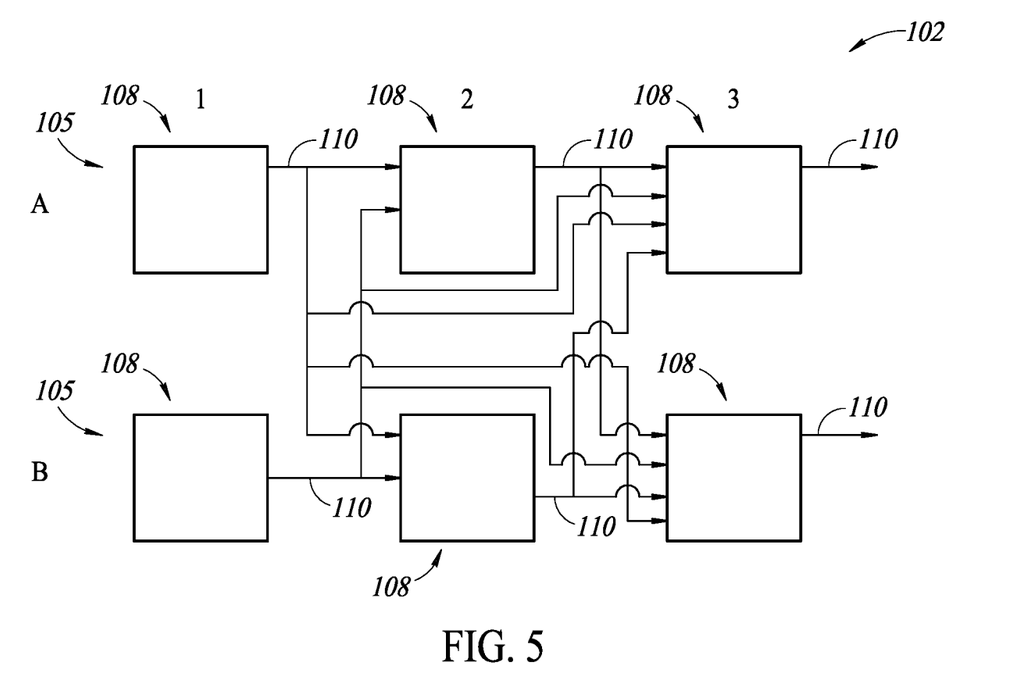
FIG. 5 is a block diagram of multiple blocks of a PLA, according to one embodiment.

FIG. 5 is a block diagram of the PLA 102, in accordance with some embodiments. The PLA 102 includes two blocks (rows) of logic elements 108. Each row includes three logic elements 108. Accordingly, there are three columns 1-3 of logic elements. Each logic element 108 may be substantially identical to the logic elements 108 of FIG. 3.

FIG. 5 illustrates an embodiment in which the direct output of each logic element 108 is provided to an input of each of the logic elements 108 of higher rank, regardless of block value. Accordingly, the logic elements 108 of block A can be provided to inputs of logic elements 108 of blocks A and B, and the logic elements one of block B can be provided to the inputs of logic elements 108 of blocks A and B, as long as the receiving logic element 108 has a higher rank. The direct outputs 107 are connected to the inputs of other logic elements 108 by the direct interconnects 110.

For simplicity in illustrating the principle that direct inputs can be provided to logic elements of other rows, the synchronous interconnects 112 are not shown in FIG. 5. However, synchronous interconnects 112 are present and connect the synchronous outputs of each logic element 108 to an input of each logic element 108, regardless of row or rank.

In practice, the PLA 102 can include four rows and columns as shown in FIG. 4. The PLA 102 can include other numbers of rows and columns without departing from the scope of the present disclosure.

Figure 6:
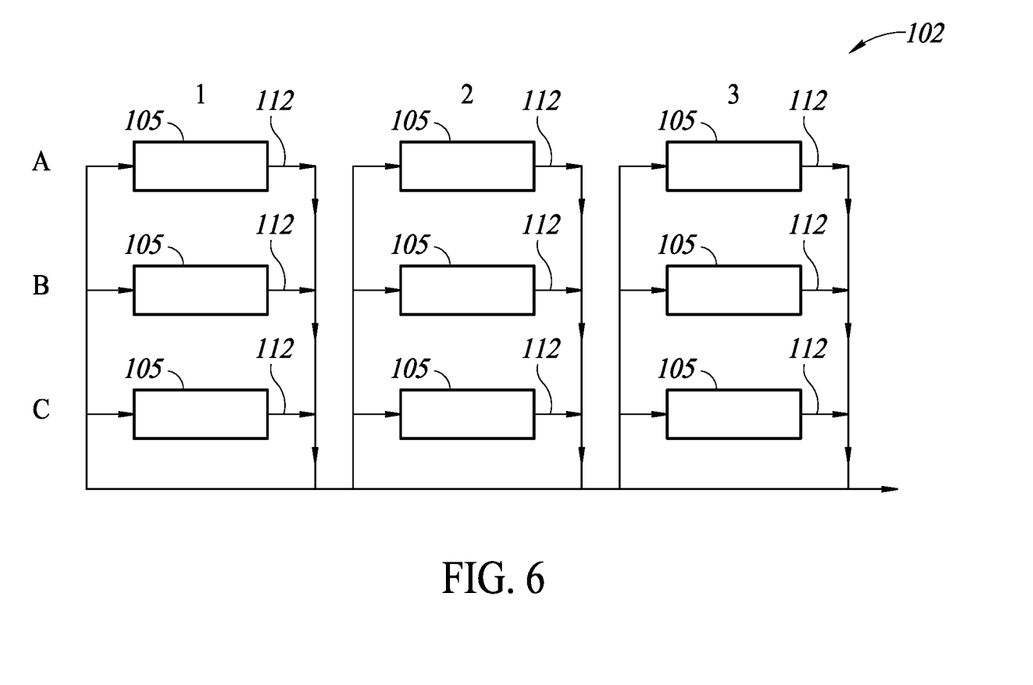
FIG. 6 is a block diagram of multiple blocks of the PLA, according to one embodiment.

FIG. 6 is a block diagram of the PLA 102, according to one embodiment. The PLA 102 includes a plurality of blocks 105. Each block 105 corresponds to a row of logic elements 108, as shown previously. The synchronous outputs of each block 105 can be provided as inputs to any of the other blocks 105. The direct outputs of the logic elements 108 of each block 105 can be interconnected within the block 105 in accordance with rank constraints described previously. Other numbers of blocks can be utilized without departing from the scope of the present disclosure.

Figure 7:
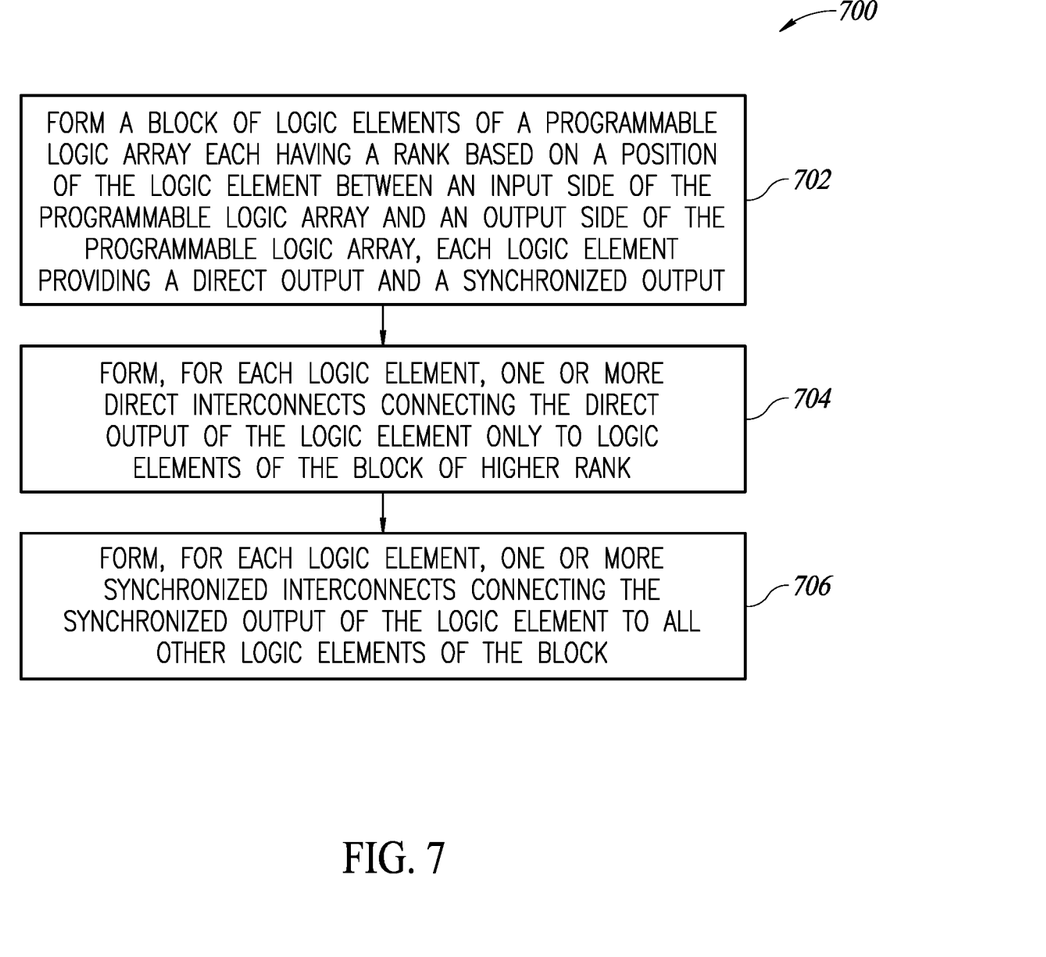
FIG. 7 is a flow diagram of a method for forming a PLA, according to one embodiment.

FIG. 7 is a flow diagram of a method 700 for forming a PLA, according to one embodiment. The method 700 can utilize systems, components, and processes described in relation to FIGS. 1-6. At 702, the method 700 includes forming a block of logic elements of a programmable logic array each having a rank based on a position of the logic element between an input side of the programmable logic array and an output side of the programmable logic array. Each logic element provides a direct output and a synchronized output. At 704, the method 700 includes forming, for each logic element, one or more direct interconnects connecting the direct output of the logic element only to all logic elements of the block of higher rank.

At 706, the method 700 includes forming, for each logic element, one or more synchronized interconnects connecting the synchronized output of the logic element to all other logic elements of the block.

Figure 8:
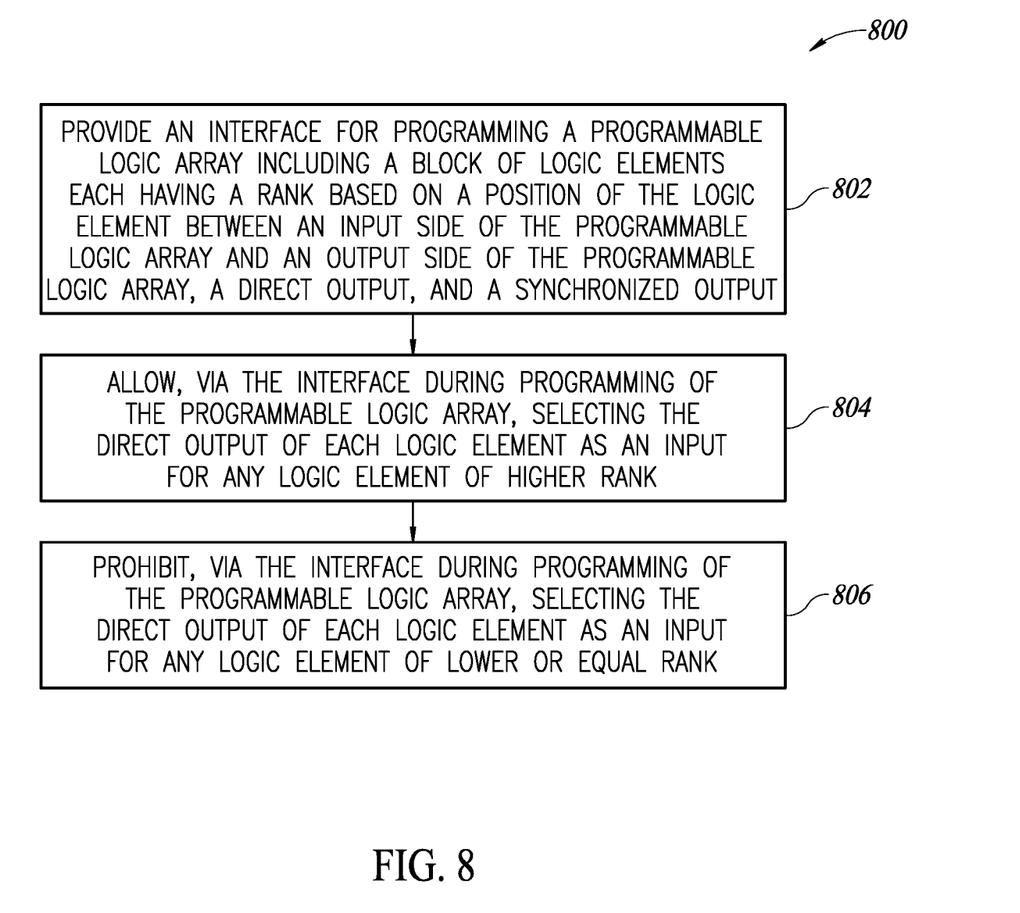
FIG. 8 is a flow diagram of a method for forming a PLA, according to one embodiment.

FIG. 8 is a flow diagram of a method 800 for forming a PLA, according to one embodiment. The method 800 can utilize systems, components, and processes described in relation to FIGS. 1-6. At 802, the method 800 includes providing an interface for programming a programmable logic array including a block of logic elements each having a rank based on a position of the logic element between an input side of the programmable logic array and an output side of the programmable logic array, a direct output, and a synchronized output. At 804, the method 800 includes allowing, via the interface during programming of the programmable logic array, selecting the direct output of each logic element as an input for any logic element of higher rank. At 806, the method 800 includes prohibiting, via the interface during programming of the programmable logic array, selecting the direct output of each logic element as an input for any logic element of equal or lower rank.

In one embodiment, an integrated circuit includes a PLA. The PLA includes an input side, an output side, and a row of logic elements. Each logic element includes a plurality of inputs, a direct output, and a synchronized output. The PLA includes a plurality of direct interconnects connecting the direct output of each logic element to an input of each of the logic elements of higher rank but not to logic elements of equal or lower rank, wherein rank indicates relative distance of the logic element from the input side.

In one embodiment, an integrated circuit includes a PLA. The PLA includes an array of logic elements arranged in rows and columns. Each logic element includes a plurality of inputs and a direct output. The PLA includes a plurality of direct interconnections that couple the direct output of each logic element of each row to logic elements downstream from the logic element in the row and that do not couple the direct output of each logic element of each row to logic elements upstream from the logic element in the row.

In one embodiment, a method includes forming a row of logic elements of a programmable logic array each including a direct output and a synchronized output. The method includes forming a plurality of direct interconnects coupling the direct output of each logic element only to logic elements downstream from the logic element and forming a plurality of synchronized interconnects coupling the synchronized output of each logic element to all other logic elements of the row.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising a PLA, the PLA including:
   an input side;
   an output side;
   a row of logic elements each including:
      a plurality of inputs;
      a direct output; and
      a synchronized output; and
   a plurality of direct interconnects connecting the direct output of each logic element to an input of each of the logic elements of higher rank but not to logic elements of lower rank, wherein rank indicates relative distance of the logic element from the input side.

2. The integrated circuit of claim 1, wherein the direct interconnects connect the direct output of each logic element to one of the inputs of that logic element.

3. The integrated circuit of claim 1, wherein the PLA includes a plurality of synchronized interconnects connecting the synchronized output of each logic element to an input of each of the logic elements of the row.

4. The integrated circuit of claim 1, wherein each logic element includes:
   a multiplexer having:
      inputs corresponding to the inputs of the logic element; and
      a plurality of outputs;
   a programmable memory coupled to the plurality of outputs of the multiplexer and including a plurality of data cells and an output; and
   a flip-flop having a data input coupled to the output of the programmable memory.

5. The integrated circuit of claim 4, wherein the output of the programmable memory is the direct output of the logic element.

6. The integrated circuit of claim 5, wherein the flip-flop includes:
   a clock input terminal that receives a clock signal of the PLA; and
   a data output corresponding to the synchronized output of the logic element.

7. The integrated circuit of claim 6, comprising a clock generator configured to provide the clock signal to the PLA.

8. The integrated circuit of claim 4, wherein data values on the outputs of the multiplexer correspond to an address for a data cell of the programmable memory.

9. The integrated circuit of claim 4, wherein the programmable memory includes a register.

10. The integrated circuit of claim 1, comprising a controller coupled to the PLA and configured to program the PLA.

11. An integrated circuit comprising a PLA, the PLA including:
   an array of logic elements arranged in rows and columns, each logic element including:
      a plurality of inputs; and
      a direct output; and
   a plurality of direct interconnections that couple the direct output of each logic element of each row to logic elements downstream from the logic element in the row and that do not couple the direct output of each logic element of each row to logic elements upstream from the logic element in the row.

12. The integrated circuit of claim 11, wherein the direct interconnections couple the direct output of each logic element to the logic elements in columns downstream from the logic element.

13. The integrated circuit of claim 11, wherein each logic element includes a synchronous output.

14. The integrated circuit of claim 13, wherein the PLA includes a plurality of synchronized interconnects connecting the synchronized output of each logic element to an input of each of the logic elements of the array.

15. The integrated circuit of claim 11, wherein each logic element includes:
   a multiplexer having:
      inputs corresponding to the inputs of the logic element; and
      a plurality of outputs;

a programmable memory coupled to the plurality of outputs of the multiplexer and including a plurality of data cells and an output; and a flip-flop coupled to the output of the programmable memory and having a data input coupled to the output of the programmable memory.

16. A method, comprising:

forming a row of logic elements of a programmable logic array each including a direct output and a synchronized output;

forming a plurality of direct interconnects coupling the direct output of each logic element only to logic elements downstream from the logic element; and forming a plurality of synchronized interconnects coupling the synchronized output of each logic element to all other logic elements of the row.

17. The method of claim 16, wherein forming the row of logic elements includes, for each logic element:

forming a multiplexer having:
inputs corresponding to the inputs of the logic element; and
a plurality of outputs;

forming a programmable memory coupled to the plurality of outputs of the multiplexer and including a plurality of data cells and an output; and forming a flip-flop coupled to the output of the programmable memory and having a data input coupled to the output of the programmable memory.

18. The method of claim 17, wherein the output of the programmable memory is the direct output of the logic element.

19. The method of claim 17, wherein the flip-flop includes:

a clock input terminal that receives a clock signal of the PLA; and a data output corresponding to the synchronized output of the logic element.

20. The method of claim 16, wherein the memory includes a register.

* * * * *